United States Patent [19]

Oikawa et al.

[11] Patent Number: 5,629,134
[45] Date of Patent: May 13, 1997

[54] CHEMICALLY AMPLIFIED POSITIVE RESIST COMPOSITION

[75] Inventors: Katsuyuki Oikawa; Toshinobu Ishihara, both of Nakakubiki-gun; Fujio Yagihashi, Kawasaki; Akinobu Tanaka, Fujisawa; Yoshio Kawai; Jiro Nakamura, both of Isehara, all of Japan

[73] Assignees: Shin-Etsu Chemical Co., Ltd.; Nippon Telegraph and Telephone Corp., both of Tokyo, Japan

[21] Appl. No.: 539,759

[22] Filed: Oct. 6, 1995

[30] Foreign Application Priority Data

Oct. 7, 1994 [JP] Japan ............... 6-270579

[51] Int. Cl.$^6$ ............... G03C 1/492; G03C 1/494; G03C 1/76
[52] U.S. Cl. ............... 430/270.1; 430/281.1; 430/326; 430/905
[58] Field of Search ............... 430/270, 281, 430/326, 905

[56] References Cited

U.S. PATENT DOCUMENTS

| | | | |
|---|---|---|---|
| 4,914,006 | 4/1990 | Kato et al. | 430/326 |
| 5,091,285 | 2/1992 | Watanabe et al. | 430/330 |
| 5,100,768 | 3/1992 | Niki et al. | 430/270 |
| 5,272,036 | 12/1993 | Tani et al. | 430/326 |
| 5,310,619 | 5/1994 | Crivello et al. | 430/270 |
| 5,364,738 | 11/1994 | Kondo et al. | 430/270 |

*Primary Examiner*—Geraldine Letscher
*Attorney, Agent, or Firm*—Millen, White, Zelano & Branigan, P.C.

[57] ABSTRACT

In a chemically amplified positive resist composition comprising an organic solvent, an alkali soluble resin, an acid generator, and an optional dissolution inhibitor, a salt of a pyridine which may have an alkyl, alkoxy, amino or dialkylamino group with an alkylsulfonic acid, arylsulfonic acid or halogen atom is blended. Because of high sensitivity to deep UV and resolution and elimination of the PED problem causing T-top pattern configuration and the skirting phenomenon, the resist composition is improved in dimensional precision and lends itself to fine patterning.

19 Claims, No Drawings

CHEMICALLY AMPLIFIED POSITIVE RESIST COMPOSITION

BACKGROUND OF THE INVENTION

1. Field of the Invention

This invention relates to a chemically amplified positive resist composition which is highly sensitive to high energy radiation such as deep-ultraviolet ray, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching to the essential limit of resolution which is dictated by the wavelength of a light source. It is generally recognized that in light exposure using g-line (wavelength 436 nm) or i-line (wave-length 365 nm) as a light source, a pattern rule of about 0.5 µm is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Under such circumstances, deep-ultraviolet lithography is regarded promising as the next generation of fine patterning technology. The deep-UV lithography is capable of working on the order of 0.3 to 0.4 µm. If a less light absorbing resist is used, it is possible to form a pattern having a side wall nearly perpendicular to the substrate.

Recently developed were chemically amplified positive working resist materials using acid catalysts as disclosed in JP-B 27660/1990, JP-A 27829/1988, U.S. Pat. No. 4,491,628 and 5,310,619. These materials are promising resist materials especially suited for deep-UV lithography since they allow a high intensity KrF excimer laser to be utilized as a deep-UV light source and have high sensitivity, resolution and dry etching resistance.

Prior art chemically amplified positive resists, however, suffer from the problem known as post-exposure delay (PED) that when deep-UV, electron beam or X-ray lithography is carried out, line patterns would have a T-top configuration, that is, patterns become thick at the top if the leave-to-stand or delay time from exposure to post-exposure baking (PEB) is extended. There also arises a "skirting" phenomenon that the pattern is widened at the bottom because a portion of the resist in contact with the substrate is incompletely dissolved and left upon development. These problems not only make difficult dimensional control in the lithographic process, but also adversely affect dimensional control in the processing of substrates using dry etching. In this regard, reference is made to W. Hinsberg et al., J. Photopolym. Sci. Technol., 6 (4), 535–546 (1993) and T. Kumada et al., J. Photopolym., Sci. Technol., 6 (4), 571–574 (1993). There are available no chemically amplified positive resists which can solve these problems and are thus practically acceptable.

It is understood for these chemically amplified positive resist materials that basic compounds in the air largely participate in the PED problem and basic compounds on the substrate surface largely participate in the skirting phenomenon. Light exposure generates acids at the resist surface which react with basic compounds in the air and also with basic compounds on the substrate surface at the junction between the resist and the substrate and are thereby deactivated. Then insolubilized layers are formed at the resist and substrate surfaces, resulting in T-top configured and skirting patterns.

It is known from JP-A 232706/1993 and 249683/1993 that addition of a basic compound to the resist material suppresses the influence of basic compounds in the air and is also effective for solving the PED problem. However, the basic compound used therein is little taken into the resist film due to volatilization, less compatible with resist components, and unevenly dispersible in a resist film. Thus the basic compound cannot achieve its advantages in a reproducible manner and causes a drop of resolving power.

It is believed that the skirting phenomenon occurs because the pattern profile largely depends on a substrate and especially when the substrate is a nitride film, N-H bonds in the nitride film deactivate acid at the chemically amplified resist/nitride film substrate interface. This problem can be solved by treating a nitride film with an oxygen plasma and an acid chemical (see Usujima et al., Preprint of 1994 Spring Meeting of Applied Physical Society, page 566, 29a, MB-10). This process requires an oxygen plasma generating system which is very expensive.

There is a strong demand for a chemically amplified positive working resist material which is improved in dimensional precision.

SUMMARY OF THE INVENTION

Therefore, an object of the present invention is to provide a chemically amplified positive working resist composition which is improved in dimensional precision by solving the PED problem causing T-top pattern configuration and the skirting phenomenon and has sufficiently high resolution to comply with a fine patterning technique.

We have found that by blending a salt of pyridine or pyridine derivative as represented by the general formula (1) with an organic solvent, an alkali soluble resin, an acid generator, and an optional dissolution inhibitor having an acid unstable group, there is obtained a chemically amplified positive resist composition which has sufficiently high resolution to comply with a fine patterning technique and is most effective when combined with deep-UV lithography.

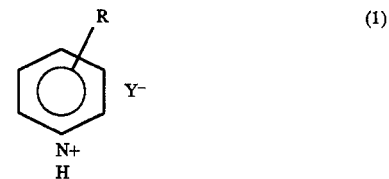

In the formula, R is a hydrogen atom, alkyl, alkoxy, amino or dialkylamino group and Y is an alkylsulfonic acid, arylsulfonic acid or halogen atom.

When a nitrogenous compound in the form of a pyridine salt of formula (1) is blended with resist components, the pyridine salt is very compatible with the resist components and uniformly dispersible in a resist film, which film has an improved resolving power. Since the influence of deactivation of acid on the resist surface by a basic compound in the air or a basic compound on the substrate surface is minimized, the PED problem causing T-top configuration and the skirting phenomenon causing pattern bottom thickening are eliminated. This is true even when the substrate is a nitride film. The pattern produced is improved in dimensional precision. That is, a chemically amplified positive resist composition of improved performance is obtained.

Accordingly, the present invention provides a chemically amplified positive resist composition comprising (A) an organic solvent, (B) an alkali soluble resin, (C) an optional dissolution inhibitor having an acid unstable group, and (D) an acid generator, wherein (E) a pyridine salt of formula (1) is further blended.

DETAILED DESCRIPTION OF THE INVENTION

According to the present invention, a chemically amplified positive working resist composition contains (A) an organic solvent, (B) an alkali soluble resin, (C) an optional dissolution inhibitor having an acid unstable group, and (D) an acid generator.

Examples of organic solvent (A) include ketones such as cyclohexanone and methyl-2-n-amylketone; alcohols such as 3-methoxybutanol, 3-methyl-3-methoxybutanol, 1-methoxy-2-propanol and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether (diglyme); and esters such as propylene glycol monomethyl ether acetate, propylene glycol monoethyl ether acetate, ethyl lactate, ethyl pyruvate, butyl acetate, methyl 3-methoxypropionate and ethyl 3-ethoxypropionate, alone or in admixture of two or more. The most preferred solvents are diglyme and 1-ethoxy-2-propanol because the acid generator of the resist composition is most soluble therein. The organic solvent is preferably used in an amount of about 200 to 1,000 parts, more preferably about 400 to 800 parts by weight per 100 parts by weight of alkali soluble resin (B).

Preferred examples of alkali soluble resin (B) as the base resin are polyhydroxystyrene derivatives wherein hydrogen atoms of some OH groups of polyhydroxystyrene are replaced by acid unstable groups, typically tert-butoxycarbonyl groups although the resin is not limited thereto. The polyhydroxystyrene derivatives should preferably have a weight average molecular weight of about 5,000 to about 100,000 and a degree of substitution of 10 to 50 mol %.

Examples of acid generator (D) include triphenylsulfonium triflates and triphenylsulfonium tosylates. (Note that triflate is an abbreviation of trifluoromethanesulfonic ester and tosylate is an abbreviation of p-toluenesulfonic ester.) The acid generator is preferably used in an amount of about 1 to 20 parts, more preferably about 2 to 10 parts by weight per 100 parts by weight of alkali soluble resin (B).

Dissolution inhibitor (C) is optionally added to the composition of the invention. It should have at least one group which is decomposable with an acid (acid unstable group) in a molecule. Examples are bisphenol A derivatives and phenolphthalein derivatives, especially those derivatives wherein hydrogen atoms of hydroxyl groups are replaced by tert-butoxycarbonyl groups. The dissolution inhibitor is preferably used in an amount of about 5 to 50 parts, more preferably about 10 to 30 parts by weight per 100 parts by weight of alkali soluble resin (B).

According to the present invention, a salt of pyridine or pyridine derivative, often referred to as a pyridine salt, of the general formula (1) is blended in the chemically amplified positive resist composition containing the above-mentioned components.

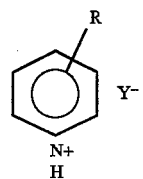

In the formula, R is a hydrogen atom, alkyl, alkoxy, amino or dialkylamino group and Y is an alkylsulfonic acid, arylsulfonic acid or halogen atom.

Preferred examples of R include a hydrogen atom, alkyl groups having 1 to 3 carbon atoms such as methyl and ethyl, alkoxy groups having 1 to 3 carbon atoms such as methoxy and ethoxy, an amino group, and dialkylamino groups whose alkyl moiety has 1 to 3 carbon atoms such as dimethylamino and diethylamino groups. Preferred examples of Y include alkylsulfonic acids such as trifluoromethanesulfonic acid, arylsulfonic acids such as p-toluenesulfonic acid, and halogen atoms such as chlorine, bromine and iodine, with the trifluoromethanesulfonic acid and p-toluenesulfonic acid being especially preferred.

Examples of the pyridine salt of formula (1) include pyridine hydrochloride, collidine hydrochloride, 4-N,N-dimethylaminopyridine hydrochloride, 4-(1-morpholino) pyridine hydrochloride, 2-methoxypyridine hydrochloride, 2-ethoxypyridine hydrochloride, pyridinium tosylate, collidinium tosylate, 4-N,N-dimethylaminopyridinium tosylate, 4-(1-morpholino)pyridinium tosylate, 2-methoxypyridinium tosylate, 2-ethoxypyridinium tosylate, pyridinium triflate, collidinium triflate, 4-N,N-dimethylaminopyridinium triflate, 4-(1-morpholino)pyridinium triflate, 2-methoxypyridinium triflate, and 2-ethoxypyridinium triflate.

Preferably the pyridine salt of formula (1) is blended in an amount of about 0.05 to 0.4 part by weight per 100 parts by weight of alkali soluble resin (B). On this basis, less than 0.01 part of the pyridine salt would be less effective for profile improvement whereas more than 1 part of the pyridine salt would sometimes detract from resolution.

In addition to the above-mentioned components, the resist composition of the invention may further contain additives, for example, a surfactant for improving coating properties, a light absorbing substance for reducing the influence of diffused reflection from the substrate, and an amine compound as an environmental stabilizer. These optional components may be added in conventional amounts insofar as the objects of the invention are not deterred.

With respect to the use of the resist composition of the invention to form a resist pattern, any of well-known lithography techniques may be used. For example, a resist pattern is formed by spin coating the resist composition on a silicon wafer to a thickness of 0.5 to 1.5 μm, pre-baking the coating at 80° to 120° C., exposing it to high energy ray such as deep UV, electron and X-ray, baking (post exposure baking PEB) at 70° to 100° C. for 60 to 120 seconds, and then developing with an alkali aqueous solution. The resist composition of the invention is best suited for fine patterning using deep UV light of 254 to 193 nm and electron beam.

There has been described a resist composition containing a pyridine salt of formula (1) which is sensitive to high energy ray such as deep UV, electron and X-ray, especially KrF excimer laser beams as a positive resist material, can be patterned by development with alkaline aqueous solution, and has high sensitivity, resolution and resistance to plasma etching with the resulting resist pattern having improved heat resistance. The resist composition has solved the PED problem causing T-top pattern configuration and the skirting phenomenon, is improved in dimensional precision, and has sufficiently high resolution to comply with a fine patterning technique. The resist composition is very useful in practice.

EXAMPLE

Examples of the present invention are given below by way of illustration and not by way of limitation.

Examples 1–20 & Comparative Examples 1–10

Liquid resist compositions were prepared by dissolving a polyhydroxystyrene derivative of the following formula Polym. 1 wherein some OH groups are protected by t-butoxycarbonyl groups, an acid generator selected from the onium salts of the following formulae PAG. 1 to PAG. 4, a dissolution inhibitor of the following formula DRI. 1 or DRI. 2, and a pyridine salt selected from the salts of the following formulae PS. 1 to PS. 6, in diethylene glycol dimethyl ether (diglyme) in accordance with the formulation shown in Table 1.

Each of the compositions was passed through a 0.2-μm Teflon® filter. It was then spin coated onto a silicon wafer to form a coating of 0.8 μm thick. With the silicon wafer rested on a hot plate at 100° C., the coating was prebaked for 120 seconds.

The film was exposed to a pattern of light by means of an excimer laser stepper model NSR 2005EXSA (manufactured by Nikon K. K., numerical aperture NA=0.5), baked at 90° C. for 60 seconds, and developed with an aqueous solution of 2.38% tetramethylammonium hydroxide, obtaining a positive pattern.

The resulting resist pattern was evaluated as follows.

First, sensitivity (Eth value) was determined. Provided that the exposure quantity with which the top and bottom of a 0.35-μm line-and-space pattern were resolved at 1:1 was the optimum exposure (sensitivity Eop), the minimum line width of a line-and-space pattern which was recognized separate at this exposure was the resolution of a test resist. The configuration of the resist pattern resolved was observed under a scanning electron microscope. The resist was determined for PED stability by exposing at the optimum exposure, leaving the resist film to stand for a varying time, and baking the film. The delay time was determined at which a change in the resist pattern configuration was observed, for example, the line pattern was T-top configured or resolution became impossible. The longer the delay time, the better is the PED stability. The skirting phenomenon was evaluated by using a nitride film substrate and observing the bottom of the pattern at the contact between the resist and the substrate.

The results are shown in Tables 1 and 2.

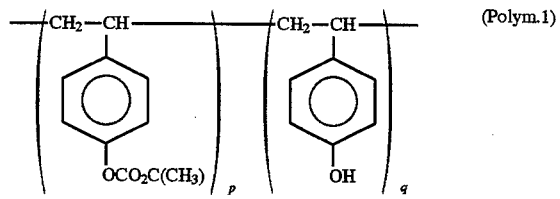
(Polym.1)

p/(p+q)=0.1~0.3

Weight average molecular weight 10,000~50,000

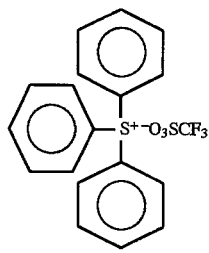
(PAG.1)

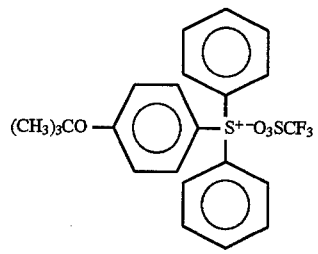
(PAG.2)

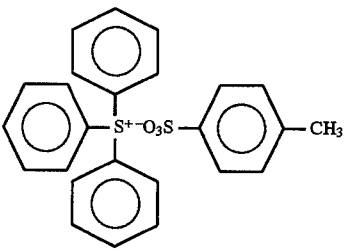
(PAG.3)

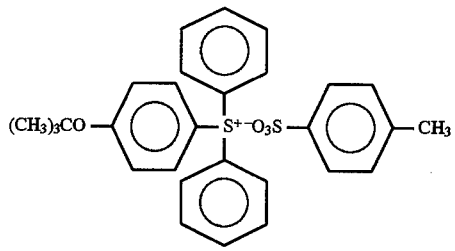
(PAG.4)

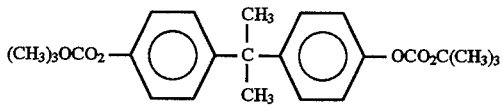
(DRI.1)

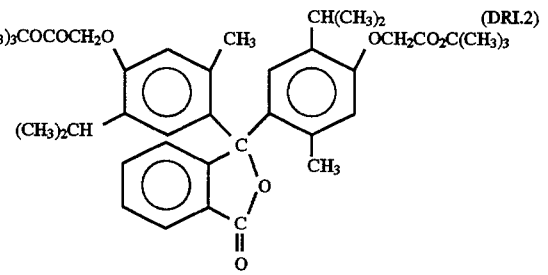
(DRI.2)

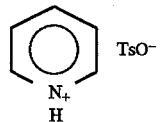
(PS.1)

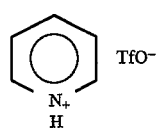 (PS.2)

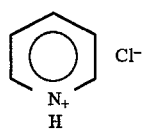 (PS.3)

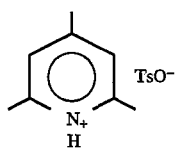 (PS.4)

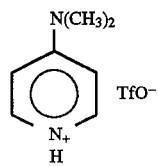 (PS.5)

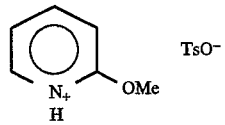 (PS.6)

TsO⁻: tosylate
TfO⁻: triflate

TABLE 1

| Example | Substrate | Alkali soluble resin | Acid generator | Dissolution inhibitor | Pyridine salt | solvent | Sensitivity: Eop (mJ/cm²) | Resolution (μm) | Skirting | PED Stability (min.) |
|---|---|---|---|---|---|---|---|---|---|---|
| 1 | Si | Polym. 1 (80) | PAG. 1 (5) | DRI. 1 (14) | PS. 1 (0.1) | diglyme (300) | 4.5 | 0.24 | nil | ≧120 |
| 2 | Si | Polym. 1 (80) | PAG. 2 (5) | DRI. 1 (14) | PS. 2 (0.1) | diglyme (300) | 5.5 | 0.22 | nil | ≧120 |
| 3 | Si | Polym. 1 (80) | PAG. 3 (3) | DRI. 1 (14) | PS. 3 (0.1) | diglyme (300) | 14.0 | 0.24 | nil | ≧120 |
| 4 | Si | Polym. 1 (80) | PAG. 4 (3) | DRI. 1 (14) | PS. 4 (0.1) | diglyme (300) | 17.0 | 0.22 | nil | ≧120 |
| 5 | Si | Polym. 1 (80) | PAG. 1(5) PAG. 2(5) | DRI. 1 (14) | PS. 5(0.1) PS. 6(0.1) | diglyme (300) | 12.0 6.5 | 0.24 0.22 | nil | ≧120 |
| 6 | Si | Polym. 1 (80) | PAG. 1 (5) | DRI. 2 (14) | PS. 1 (0.1) | diglyme (300) | 6.5 | 0.24 | nil | ≧120 |
| 7 | Si | Polym. 1 (80) | PAG. 2 (5) | DRI. 2 (14) | PS. 2 (0.1) | diglyme (300) | 7.0 | 0.22 | nil | ≧120 |
| 8 | Si | Polym. 1 (80) | PAG. 3 (3) | DRI. 2 (14) | PS. 1 (0.2) | diglyme (300) | 17.0 | 0.24 | nil | ≧120 |
| 9 | Si | Polym. 1 (80) | PAG. 4 (3) | DRI. 2 (14) | PS. 2 (0.2) | diglyme (300) | 19.0 | 0.22 | nil | ≧120 |
| 10 | Si | Polym. 1 (80) | PAG. 1 (5) | DRI. 1 (14) | PS. 1(0.1) PS. 2(0.1) | diglyme (300) | 7.0 | 0.24 | nil | ≧120 |
| 11 | Si | Polym. 1 (80) | PAG. 2 (5) | DRI. 1 (14) | PS. 3(0.1) PS. 4(0.1) | diglyme (300) | 9.0 | 0.22 | nil | ≧120 |
| 12 | Si | Polym. 1 (80) | PAG. 2 (5) | DRI. 1 (14) | PS. 5(0.1) PS. 6(0.1) | diglyme (300) | 18.0 | 0.22 | nil | ≧120 |
| 13 | Si | Polym. 1 (80) | PAG. 1 (5) | — | PS. 1 (0.1) | diglyme (300) | 4.0 | 0.26 | nil | ≧120 |
| 14 | Si | Polym. 1 (80) | PAG. 2 (5) | — | PS. 2 (0.1) | diglyme (300) | 5.0 | 0.24 | nil | ≧120 |
| 15 | SiN | Polym. 1 (80) | PAG. 1 (5) | DRI. 1 (14) | PS. 1 (0.1) | diglyme (300) | 5.5 | 0.24 | small | ≧120 |
| 16 | SiN | Polym. 1 (80) | PAG. 2 (5) | DRI. 1 (14) | PS. 2 (0.1) | diglyme (300) | 6.5 | 0.22 | small | ≧120 |
| 17 | SiN | Polym. 1 (80) | PAG. 2 (5) | DRI. 1 (14) | PS. 6 (0.1) | diglyme (300) | 8.0 | 0.22 | small | ≧120 |
| 18 | SiN | Polym. 1 (80) | PAG. 1 (5) | DRI. 1 (14) | PS. 1 (0.1) PS. 2(0.1) | diglym (300) | 8.0 | 0.24 | small | ≧120 |
| 19 | TiN | Polym. 1 (80) | PAG. 1 (5) | DRI. 2 (14) | PS. 1 (0.1) | diglyme (300) | 8.5 | 0.24 | small | ≧120 |
| 20 | TiN | Polym. 1 (80) | PAG. 2 (5) | DRI. 2 (14) | PS. 2 (0.1) | diglyme (300) | 9.0 | 0.22 | small | ≧120 |
| 21 | TiN | Polym. 1 (80) | PAG. 1 (5) | DRI. 1 (14) | PS. 5 (0.1) | diglyme (300) | 19.0 | 0.24 | small | ≧120 |
| 22 | SiO₂ | Polym. 1 (80) | PAG. 3 (3) | DRI. 1 (14) | Ps.3 (0.1) | diglyme (300) | 15.5 | 0.24 | slight | ≧120 |

TABLE 1-continued

| Example | Substrate | Alkali soluble resin | Acid generator | Dissolution inhibitor | Pyridine salt | solvent | Sensitivity: Eop (mJ/cm$^2$) | Resolution (µm) | Skirting | PED Stability (min.) |
|---|---|---|---|---|---|---|---|---|---|---|
| 23 | SiO$_2$ | Polym. 1 (80) | PAG. 4 (3) | DRI. 1 (14) | PS. 4 (0.1) | diglyme (300) | 18.5 | 0.22 | slight | ≧120 |
| 24 | SiO$_2$ | Polym. 1 (80) | PAG. 2 (5) | DRI. 1 (14) | PS. 3 (0.1) PS. 4 (0.1) | diglyme (300) | 6.0 | 0.22 | slight | ≧120 |

TABLE 2

| Comparative Example | Substrate | Alkali soluble resin | Acid generator | Dissolution inhibitor | Pyridine salt | solvent | Sensitivity: Eop (mJ/cm$^2$) | Resolution (µm) | Skirting | PED Stability (min.) |
|---|---|---|---|---|---|---|---|---|---|---|
| 1 | Si | Polym. 1 (80) | PAG. 1 (5) | DRI. 1 (14) | — | diglyme (300) | 4.0 | 0.24 | nil | 15–30 |
| 2 | Si | Polym. 1 (80) | PAG. 2 (5) | DRI. 2 (14) | — | diglyme (300) | 5.5 | 0.22 | nil | 15–30 |
| 3 | Si | Polym. 1 (80) | PAG. 3 (3) | DRI. 1 (14) | — | diglyme (300) | 12.0 | 0.24 | nil | 15–30 |
| 4 | Si | Polym. 1 (80) | PAG. 3 (3) | DRI. 1 (14) | — | diglyme (300) | 15.0 | 0.22 | nil | 15–30 |
| 5 | SiN | Polym. 1 (80) | PAG. 1 (5) | DRI. 1 (14) | — | diglyme (300) | 6.0 | 0.26 | medium | 15–30 |
| 6 | SiN | Polym. 1 (80) | PAG. 2 (5) | DRI. 2 (14) | — | diglyme (300) | 8.0 | 0.26 | medium | 15–30 |
| 7 | TiN | Polym. 1 (80) | PAG. 1 (5) | DRI. 1 (14) | — | diglyme (300) | 6.5 | 0.28 | large | 15–30 |
| 8 | TiN | Polym. 1 (80) | PAG. 2 (5) | DRI. 2 (14) | — | diglyme (300) | 9.0 | 0.28 | large | 15–30 |
| 9 | SiO$_2$ | Polym. 1 (80) | PAG. 3 (3) | DRI. 1 (14) | — | diglyme (300) | 17.0 | 0.26 | samll | 15–30 |
| 10 | SiO$_2$ | Polym. 1 (80) | PAG. 4 (3) | DRI. 1 (14) | — | diglyme (300) | 21.0 | 0.24 | small | 15–30 |

As seen from Table 1, the chemically amplified positive resist compositions of the present invention have good sensitivity and high resolution and prevents the line pattern from being T-top configured or raising the skirting phenomenon.

Japanese Patent Application No. 270579/1994 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A composition comprising (A) an organic solvent, (B) an alkali soluble resin having an acid unstable group, (C) optionally a dissolution inhibitor having an acid unstable group, (D) an acid generator other than a pyridine salt, and (E) a pyridine salt of formula (1):

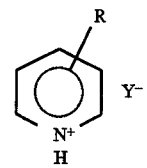

(1)

wherein R is a hydrogen atom, an alkyl, an alkoxy, an amino, or a dialkyl amino group and Y is an alkylsulfonic acid, an arylsulfonic acid, or a halogen atom, wherein said composition is a chemically amplified positive resist composition.

2. A resist composition according to claim 1, wherein the organic solvent (A) is a ketone, alcohol, ether, ester, or a mixture thereof.

3. A resist composition according to claim 2, wherein the organic solvent (A) is cyclohexanone, methyl-2-n-amylketone, 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol dimethyl ether, diethylene glycol dimethyl ether, propylene glycol monomethyl ether acetate, propylene glycol monoethyl ether acetate, ethyl lactate, ethyl pyruvate, butyl acetate, methyl 3-methoxypriopionate or ethyl 3-ethoxypropionate.

4. A resist composition according to claim 2, wherein the organic solvent is diglyme or 1-ethoxy-2-propanol.

5. A resist composition according to claim 2, wherein the alkali soluble resin (B) is a polyhydroxystyrene resin, in which the hydrogen atom of about 10 to 50 mol % of hydroxy groups present is replaced by an acid unstable group.

6. A resist composition according to claim 1, wherein the organic solvent is employed in an amount of about 200 to 1,000 parts by weight per 100 parts by weight of (B).

7. A resist composition according to claim 1, wherein the acid unstable group in (B) is a tert-butoxycarbonyl group.

8. A resist composition according to claim 7, wherein the acid generator (D) is

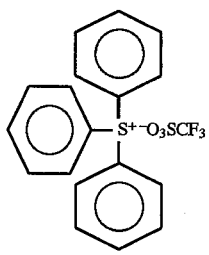
(PAG.1)

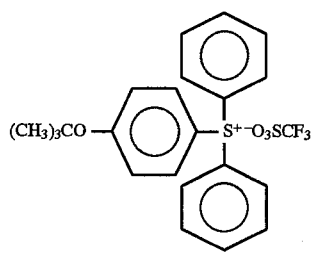
(PAG.2)

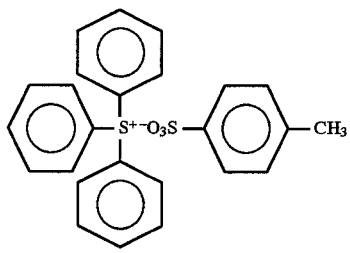
(PAG.3)

or

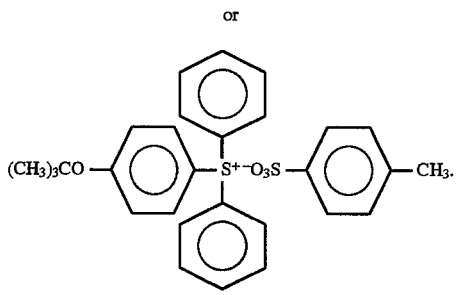
(PAG.4)

9. A resist composition according to claim 1, wherein the acid generator (D) is a triphenylsulfonium triflate or triphenylsulfonium tosylate.

10. A resist composition according to claim 1, wherein the acid generator is employed in an amount of about 1 to 20 parts by weight per 100 parts by weight of (B).

11. A resist compound according to claim 10, wherein the dissolution inhibitor is a bisphenol A or phenolphthalein compound in which at least one hydrogen atom of a hydroxyl group is replaced by a tert-butoxycarbonyl group.

12. A resist composition according to claim 1, containing a dissolution inhibitor (C) which is a bisphenol A or phenolphthalein compound.

13. A resist composition according to claim 1, containing about 10 to 30 parts by weight of a dissolution inhibitor (C) per 100 parts by weight of (B).

14. A resist composition according to claim 1, wherein R is H, $C_{1-3}$-alkyl, $C_{1-3}$alkoxy or di-$C_{1-3}$-alkylamino.

15. A resist composition according to claim 1, wherein Y is trifluoromethanesulfonic acid, p-toluene sulfonic acid, chlorine, bromine or iodine.

16. A resist composition according to claim 1, wherein Y is trifluoromethanesulfonic acid or p-toluene sulfonic acid.

17. A resist composition accordion to claim 1, wherein the pyridine salt (E) is pyridine hydrochloride, collidine hydrochloride, 4-N,N-dimethylaminopyridine hydrochloride, 4-(1-morpholino)-pyridine hydrochloride, 2-methoxypyridine hydrochloride, 2-ethoxypyridine hydrochloride, pyridinium tosylate, collidinium tosylate, 4-N,N-dimethylaminopyridinium tosylate, 4-(1-morpholinopyridinium)tosylate, 2-methoxypyridinium tosylate, 2-ethoxypyridinium tosylate, pyridinium triflate, collidinium triflate, 4-N,N-dimethylaminopyridinium triflate, 4-(1-morpholino)pyridinium triflate, 2-methoxypyridinium triflate or 2-ethoxypyridinium triflate.

18. A resist composition according to claim 1, wherein the pyridine salt (E) is used in an amount of about 0.05 to 0.4 parts by weight per 100 parts by weight of (B).

19. A composition comprising (A) an organic solvent, (B) an alkali soluble resin having an acid unstable group, (C) optionally a dissolution inhibitor having an acid unstable group, (D) 0.05 to 0.4 parts by weight per 100 parts by weight of a pyridine salt of formula (1)

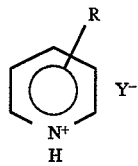
(1)

wherein R is a hydrogen atom, an alkyl, an alkoxy, an amino, or a dialkyl amino group and Y is an alkylsulfonic acid, an arylsulfonic acid, or a halogen atom, and (E) 1 to 20 parts by weight of an acid generator other than the pyridine salt of formula (1), wherein said composition is a positive resist composition.

* * * * *